United States Patent
Wang et al.

(10) Patent No.: US 12,224,712 B2
(45) Date of Patent: Feb. 11, 2025

(54) METHOD OF MAXIMIZING POWER EFFICIENCY FOR POWER AMPLIFIER SYSTEM AND POWER AMPLIFIER SYSTEM THEREOF

(71) Applicant: Rafael Microelectronics, Inc., Hsinchu County (TW)

(72) Inventors: Chung-Cheng Wang, Hsinchu (TW); Kang-Ming Tien, Hsinchu County (TW); Tzu-Yun Wang, New Taipei (TW)

(73) Assignee: Rafael Microelectronics, Inc., Hsinchu County (TW)

( * ) Notice: Subject to any disclaimer, the term of this patent is extended or adjusted under 35 U.S.C. 154(b) by 553 days.

(21) Appl. No.: 17/676,773

(22) Filed: Feb. 21, 2022

(65) Prior Publication Data

US 2023/0268888 A1    Aug. 24, 2023

(51) Int. Cl.
*H03F 1/02*    (2006.01)
*H03F 3/24*    (2006.01)
*H04B 1/04*    (2006.01)

(52) U.S. Cl.
CPC .......... *H03F 1/0238* (2013.01); *H03F 3/245* (2013.01); *H04B 2001/045* (2013.01)

(58) Field of Classification Search
CPC ........ H03F 1/0238; H03F 1/0244; H03F 1/02; H03F 3/245; H03F 3/24; H03F 3/20
USPC ........................................................ 330/297
See application file for complete search history.

(56) References Cited

U.S. PATENT DOCUMENTS

| | | | |
|---|---|---|---|
| 8,174,313 B2 * | 5/2012 | Vice ...................... | H03G 3/007 330/297 |
| 8,952,753 B2 | 2/2015 | Tournatory | |
| 2007/0188224 A1 | 8/2007 | Dow | |

FOREIGN PATENT DOCUMENTS

| | | |
|---|---|---|
| CN | 104169827 A | 11/2014 |
| CN | 108616260 A | 10/2018 |
| CN | 110418400 A | 11/2019 |
| CN | 111328388 A | 6/2020 |
| CN | 114070215 A | 2/2022 |
| TW | 202005344 A | 1/2020 |
| TW | 202143633 A | 11/2021 |

* cited by examiner

*Primary Examiner* — Andrea Lindgren Baltzell
*Assistant Examiner* — Nareh Shamiryan
(74) *Attorney, Agent, or Firm* — Winston Hsu

(57) ABSTRACT

A method of maximizing power efficiency for a power amplifier system comprises obtaining a power supply voltage; determining a first voltage level sufficient for a power amplifier of the power amplifier system to output an output power; determining a second voltage level lower than the first voltage level; determining whether the power amplifier is activated, to generate a determination result; determining to convert the power supply voltage into a supply voltage with the first voltage level or the second voltage level according to the determination result; and supplying the power amplifier with the supply voltage.

12 Claims, 3 Drawing Sheets

METHOD OF MAXIMIZING POWER EFFICIENCY FOR POWER AMPLIFIER SYSTEM AND POWER AMPLIFIER SYSTEM THEREOF

BACKGROUND OF THE INVENTION

1. Field of the Invention

The present invention relates to a method of maximizing power efficiency for a power amplifier system and a power amplifier system thereof, and more particularly, to a method of maximizing power efficiency for a power amplifier system and a power amplifier system thereof to supply a power amplifier with different voltage level according to whether the power amplifier is activated.

2. Description of the Prior Art

In recent years, wireless handheld devices often require a high-power output to transmit signals. Therefore, a supply voltage converter is usually used to convert the battery voltage into a high voltage required for the power amplifier to operate at an optimal situation. In addition, in IoT applications (Internet of Things), a wireless sensor requires a high-power output to reduce deployment costs. Therefore, the supply voltage converter is also used to convert the battery voltage into the high voltage required for the power amplifier to operate at the high-power output. However, the conversion efficiency of the supply voltage converter to convert the battery voltage to the high voltage is poor. Therefore, the main disadvantage of using the supply voltage converter in the wireless handheld device or the wireless sensor in IoT is high power consumption.

Under this circumstance, how to reduce the power consumption of the wireless handheld devices or the wireless sensor in IoT and increase the battery lifetime has become one of the goals in the industry.

SUMMARY OF THE INVENTION

The purpose of the present invention is to provide a method of maximizing power efficiency for a power amplifier system and a power amplifier system.

The present invention provides a method of maximizing power efficiency for a power amplifier system, comprising obtaining a power supply voltage; determining a first voltage level sufficient for a power amplifier of the power amplifier system to output an output power; determining a second voltage level lower than the first voltage level; determining whether the power amplifier is activated, to generate a determination result; determining to convert the power supply voltage into a supply voltage with the first voltage level or the second voltage level according to the determination result; and supplying the power amplifier with the supply voltage.

The present invention further provides a power amplifier system for maximizing power efficiency, comprising a power amplifier; a power supply, for supplying a power supply voltage; a controller, for determining whether the power amplifier is activated to generate a determination result and generate a select signal according to the determination result; and a converter, coupled to the power amplifier, the controller and the power supply, for converting the power supply voltage into a supply voltage with a first voltage level or a second voltage level to supply the power amplifier according to the select signal; wherein the second voltage level is lower than the first voltage level.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, hardware manufacturers may refer to a component by different names. This document does not intend to distinguish between components that differ in name but not function. In the following description and in the claims, the terms "include" and "comprise" are utilized in an open-ended fashion, and thus should be interpreted to mean "include, but not limited to". Also, the term "couple" is intended to mean either an indirect or direct electrical connection. Accordingly, if one device is coupled to another device, that connection may be through a direct electrical connection, or through an indirect electrical connection via other devices and connections.

Figure 1:
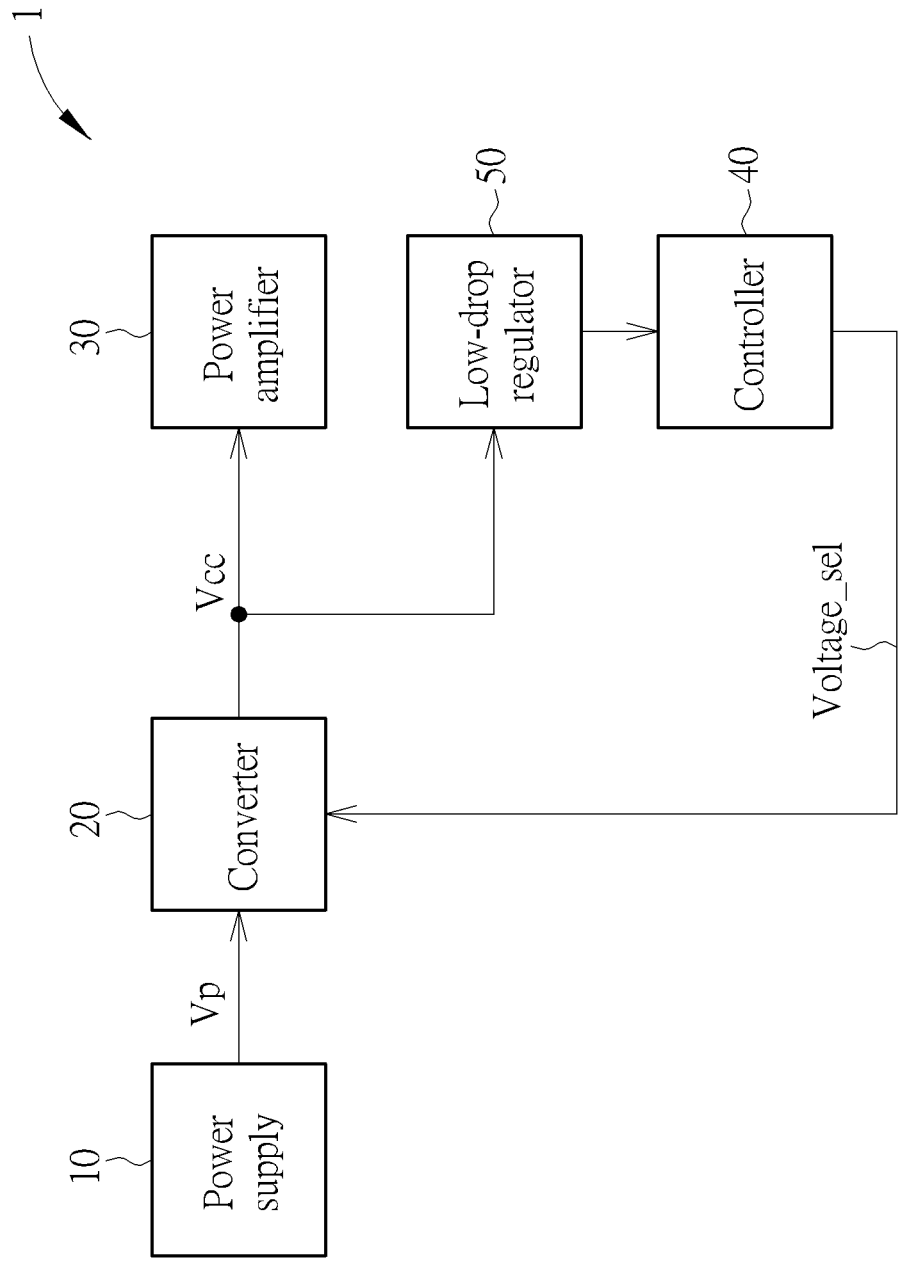
FIG. 1 is a schematic diagram of a power amplifier system according to an embodiment of the present invention.

Please refer to FIG. 1. FIG. 1 is a schematic diagram of a power amplifier system 1 according to an embodiment of the present invention. The power amplifier system 1 includes a power supply 10, a voltage converter 20, a power amplifier 30, a controller 40 and a low-drop regulator 50. The voltage converter 20 is coupled to the power supply 10, the power amplifier 30, the controller 40 and the low-drop regulator 50. The power supply 10 may supply a power supply voltage Vp to the voltage converter 20. For example, the power supply 10 may be a battery, for supplying a battery voltage to the voltage converter 20, but not limited thereto. The controller 40 is utilized for outputting a select signal voltage_sel according to whether the power amplifier 30 is activated. The voltage converter 20 outputs a supply voltage Vcc having a first voltage level or a second voltage level according to the select signal voltage_sel. The supply voltage Vcc may be supplied to the power amplifier 30 to output a data packet, or converted to a low voltage by the low-drop regulator 50 to supply the controller 40 and the other circuits other than the power amplifier 30. In detail, the voltage converter 20 outputs the supply voltage Vcc having different voltage level according to the select signal voltage_sel, which may achieve the purpose of maximizing the power efficiency of the power amplifier system.

Figure 2:
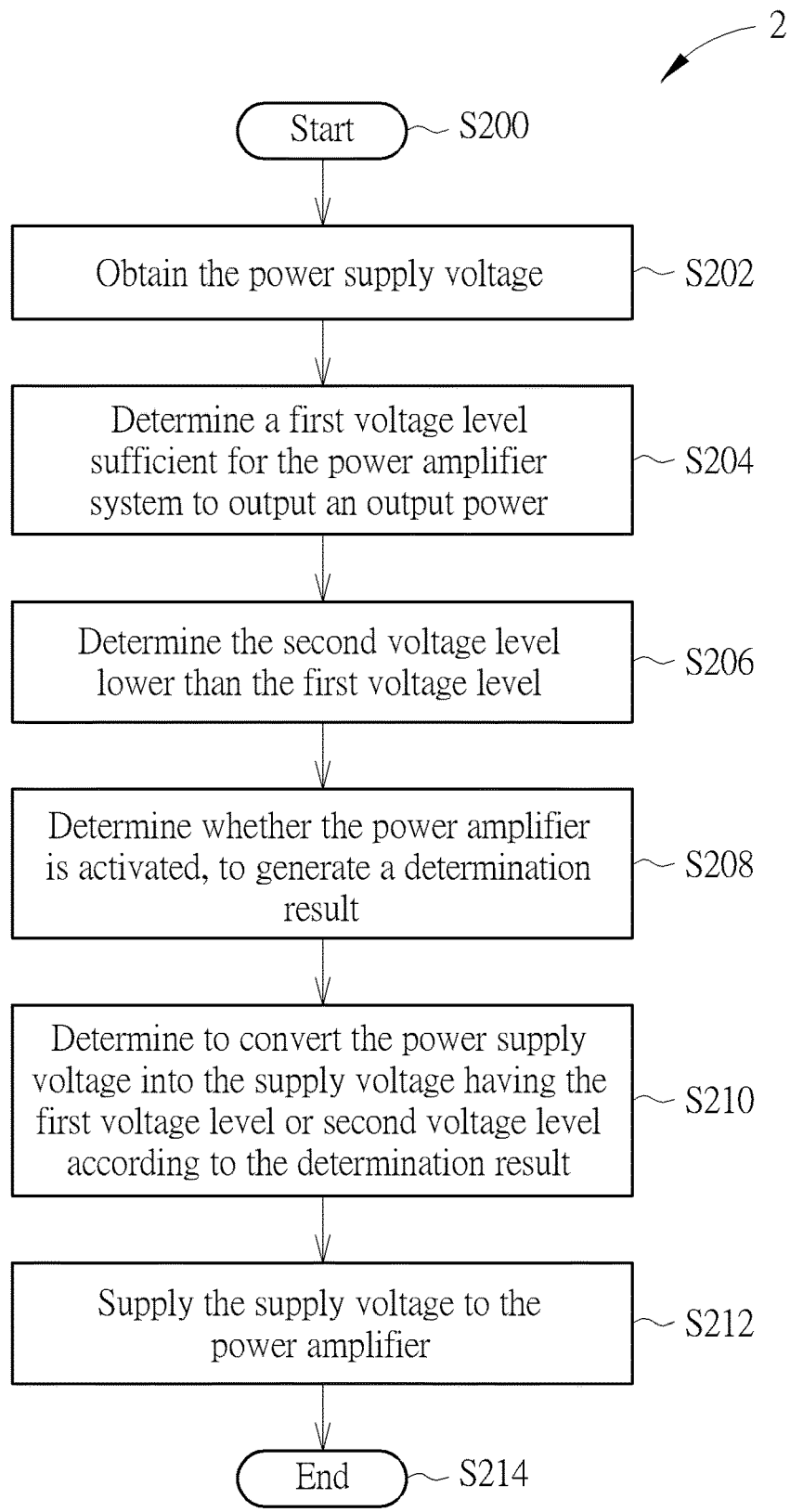
FIG. 2 is a flowchart of a process of a method of maximizing power efficiency for a power amplifier system according to the embodiment of the present invention.

Please refer to FIG. 2. The operating method of the power amplifier system 1 may be summarized as a process 2, as shown in FIG. 2. The process 2 includes the following steps:

Step S200: Start.

Step S202: Obtain the power supply voltage Vp.

Step S204: Determine the first voltage level sufficient for the power amplifier system 1 to output an output power.

Step S206: Determine the second voltage level lower than the first voltage level.

Step S208: Determine whether the power amplifier 30 is activated, to generate a determination result.

Step S210: Determine to convert the power supply voltage Vp into the supply voltage Vcc having the first voltage level or the second voltage level according to the determination result.

Step S212: Supply the supply voltage Vcc to the power amplifier.

Step S214: End.

According to the process 2, in Step S202, the power supply 10 may supply the power supply voltage Vp to the voltage converter 20. For example, the power supply 10 may be the battery that supplies the power supply voltage Vp of 3.8V. In Step S204, the controller 40 determines the first voltage level sufficient for the power amplifier system to output an output power. For example, the voltage converter 20 may convert the power supply voltage Vp into the high voltage that is enough to supply the power amplifier 30 with the highest performance. In Step S206, the controller 40 determines the second voltage level lower than the first voltage level. Note that, the second voltage level may be sufficient for the normal operation of circuits other than the controller 40 and the power amplifier 30.

In Step S208, the controller 40 may determine whether the power amplifier 30 is activated according to a communication protocol to generate the determination result, and generate the select signal voltage_sel according to the determination result, and provide the select signal voltage_sel to the voltage converter 20. In Steps S210 and S212, the voltage converter 20 determines to convert the power supply voltage Vp to the supply voltage Vcc having the first voltage level or the second voltage level according to the select signal voltage_sel. In detail, when the power amplifier 30 is activated, the higher voltage is required for the power amplifier 30 to operate at its best performance. Therefore, the voltage converter 20 converts the power supply voltage Vp into the supply voltage Vcc having the first voltage level to supply the power amplifier 30. On the other hand, when the power amplifier 30 is not activated, the supply voltage Vcc does not require the higher voltage level. Therefore, the voltage converter 20 converts the power supply voltage Vp into the supply voltage Vcc having the second voltage level.

Figure 3:
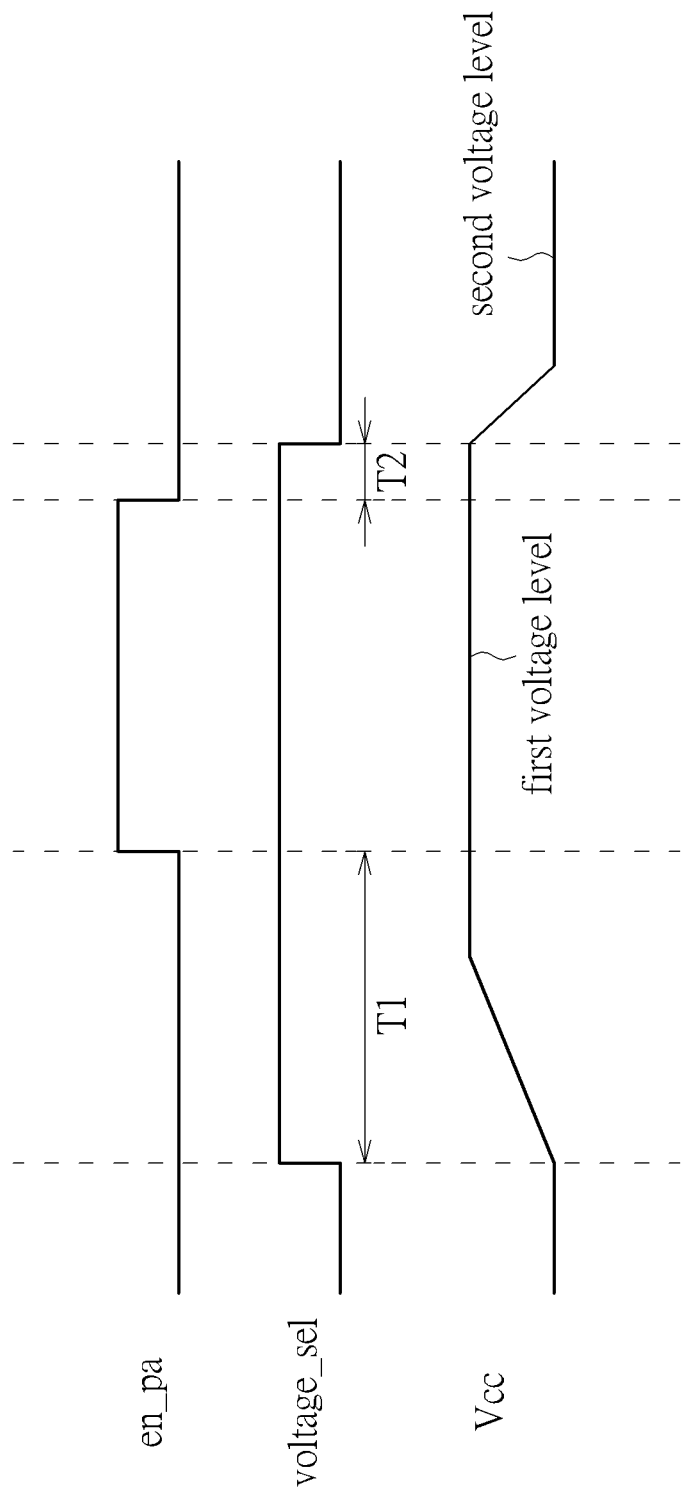
FIG. 3 is a schematic diagram of a supply voltage according to the embodiment of the present invention.

Please refer to FIG. 3. FIG. 3 is a schematic diagram of the supply voltage Vcc according to an embodiment of the present invention. In an embodiment, the controller 40 may determine whether the power amplifier 30 is activated according to the communication protocol. As shown in FIG. 3, an enable signal en_pa at high level indicates that the power amplifier 30 is activated, and the enable signal en_pa at a low level indicates that the power amplifier 30 is not activated. Therefore, the controller 40 generates the select signal voltage_sel according to the enable signal en_pa, and the voltage converter 20 determines to convert the power supply voltage Vp into the supply voltage Vcc having the first voltage level or the second voltage level according to the select signal voltage_sel. In another embodiment, the controller 40 may determine when the power amplifier 30 is activated and deactivated according to the communication protocol to generate the determination result, and generate the select signal voltage_sel according to the determination result. As shown by the select signal voltage_sel in FIG. 3, before a first time interval T1 when the power amplifier 30 is activated (the enable signal en_pa is high), the select signal voltage_sel is converted to high in advance. The voltage converter 20 converts the power supply voltage Vp into the supply voltage Vcc having the first voltage level according to the select signal voltage_sel before the power amplifier 30 is about to be activated. In addition, after a second time interval T2 when the power amplifier 30 is deactivated (the enable signal en_pa is low), the select signal voltage_sel is converted to low. The voltage converter 20 converts the power supply voltage Vp into the supply voltage Vcc having the second voltage level after the power amplifier 30 is deactivated according to the select signal voltage_sel. Accordingly, the voltage converter 20 only supplies the supply voltage Vcc having the higher first voltage level when the power amplifier 30 is activated. When the power amplifier 30 has not been activated or after the power amplifier 30 is deactivated, the voltage converter 20 supplies the supply voltage Vcc having the lower second voltage level, so that the voltage converter 20 has better conversion efficiency. In addition, the voltage converter 20 converts the supply voltage Vcc having the first voltage level or the second voltage level to maximize the power efficiency of the power amplifier system 1.

It should be noted that the power amplifier system 1 is an embodiment of the present invention. Those skilled in the art should readily make combinations, modifications and/or alterations on the abovementioned description and examples. The abovementioned description, steps, procedures and/or processes including suggested steps can be realized by means that could be hardware, software, firmware (known as a combination of a hardware device and computer instructions and data that reside as read-only software on the hardware device), an electronic system, or combination thereof. Examples of hardware can include analog, digital and mixed circuits known as microcircuit, microchip, or silicon chip. Examples of the electronic system may include a system on chip (SoC), system in package (SiP), a computer on module (CoM) and the power amplifier system 1.

Any of the abovementioned procedures and examples above may be compiled into program codes or instructions that are stored in the memory. The memory may include read-only memory (ROM), flash memory, random access memory (RAM), subscriber identity module (SIM), hard disk, floppy diskette, or CD-ROM/DVD-ROM/BD-ROM, but not limited thereto. The central processing unit may read and execute the program codes or the instructions stored in the memory for realizing the abovementioned functions.

In summary, in order to operate the power amplifier at the best performance, the voltage converter must convert the power supply voltage into the supply voltage having the high voltage level, which may increase the power consumption, and the conversion efficiency of the voltage converter to convert the power supply voltage into the high voltage is also poor. In this regard, the present invention may convert the power supply voltage into the low voltage by the voltage converter when the power amplifier is not activated, and converts the power supply voltage into the high voltage when the power amplifier is activated, which may reduce the power consumption and enhance the conversion efficiency of the voltage converter. Therefore, the present invention maximizes the power efficiency of the power amplifier system.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of maximizing power efficiency for a power amplifier system, comprising:

obtaining a power supply voltage;

determining a first voltage level sufficient for a power amplifier of the power amplifier system to output an output power;

determining a second voltage level lower than the first voltage level;

determining whether the power amplifier is activated according to a communication protocol, to generate a determination result;

determining to convert the power supply voltage into a supply voltage having the first voltage level or the second voltage level according to the determination result; and supplying the power amplifier with the supply voltage.

2. The method of claim 1, wherein the step of determining to convert the power supply voltage into the supply voltage having the first voltage level or the second voltage level according to the determination result, comprises:

converting the power supply voltage into the supply voltage having the first voltage level when the determination result indicates that the power amplifier is activated.

3. The method of claim 2, wherein the step of determining to convert the power supply voltage into the supply voltage having the first voltage level or the second voltage level according to the determination result, comprises:

converting the power supply voltage into the supply voltage having the second voltage level when the determination result indicates that the power amplifier is not activated.

4. The method of claim 1, wherein the step of determining to convert the power supply voltage into the supply voltage having the first voltage level or the second voltage level according to the determination result, comprises:

converting the power supply voltage into the supply voltage having the first voltage level when the determination result indicates that the power amplifier is to be activated but not yet activated.

5. The method of claim 4, wherein the step of determining to convert the power supply voltage into the supply voltage having the first voltage level or the second voltage level according to the determination result, comprises:

converting the power supply voltage into the supply voltage having the second voltage level when the determination result indicates that the power amplifier is not activated or has been deactivated.

6. The method of claim 1, wherein the power supply is a battery.

7. A power amplifier system for maximizing power efficiency, comprising:

a power amplifier;

a power supply, for supplying a power supply voltage;

a controller, for determining whether the power amplifier is activated according to a communication protocol to generate a determination result and generate a select signal according to the determination result; and a converter, coupled to the power amplifier, the controller and the power supply, for converting the power supply voltage into a supply voltage having a first voltage level or a second voltage level to supply the power amplifier according to the select signal;

wherein the second voltage level is lower than the first voltage level.

8. The system of claim 7, wherein the select signal indicates the converter to convert the power supply voltage into the supply voltage having the first voltage level when the determination result indicates that the power amplifier is activated.

9. The system of claim 8, wherein the select signal indicates the converter to convert the power supply voltage into the supply voltage having the second voltage level when the determination result indicates that the power amplifier is not activated.

10. The system of claim 7, wherein the select signal indicates the converter to convert the power supply voltage into the supply voltage having the first voltage level when the determination result indicates that the power amplifier is to be activated but not yet activated.

11. The system of claim 10, wherein the select signal indicates the converter to convert the power supply voltage into the supply voltage having the second voltage level when the determination result indicates that the power amplifier is not activated or has been deactivated.

12. The system of claim 7, wherein the power supply is a battery.

* * * * *